United States Patent [19]

Fournier

[11] Patent Number: 4,749,869

[45] Date of Patent: Jun. 7, 1988

[54] PROCESS FOR IRRADIATING TOPAZ AND THE PRODUCT RESULTING THEREFROM

[75] Inventor: Richard Fournier, Placentia, Calif.

[73] Assignee: Anil Dholakia, New York, N.Y.; a part interest

[21] Appl. No.: 863,083

[22] Filed: May 14, 1986

[51] Int. Cl.$^4$ .................. A21K 27/02; A61N 5/00; C08J 1/02; G21G 5/00

[52] U.S. Cl. ................................ 250/492.1; 430/4

[58] Field of Search ............... 250/492.1; 430/4; 204/157.15

[56] References Cited

U.S. PATENT DOCUMENTS

| | | | |
|---|---|---|---|
| 2,945,793 | 7/1960 | Dugdale et al. | 250/492.1 |
| 2,998,365 | 8/1961 | Custers et al. | 250/492.1 |
| 3,173,850 | 3/1965 | Hood et al. | 250/492.1 |
| 4,399,364 | 8/1983 | Evans et al. | 250/492.1 |

*Primary Examiner*—Bruce C. Anderson

*Attorney, Agent, or Firm*—Lothrop & West

[57] ABSTRACT

A process for the irradiation of topaz and the product resulting therefrom is described whereby the colorless or pale-colored topaz is immersed in a high energy neutron environment at an exposure level sufficient to bring some color to the topaz gemstone, then irradiating the topaz gemstone with electrons at an exposure level in the range of approximately 1,000 to 10,000 megarads to produce a remarkable and enhanced "American" blue color. The purpose of such a process is to enhance the value of the preferred relatively "normal" sky-blue topaz gemstone by moderately deepening the blueness of the color of the topaz gemstone to a relatively "rare" and more desirable blue color such as "American Blue" or "Super Sky Blue". A further step of heating the topaz to about a temperature in the range of from 250 to 900 degrees Fahrenheit for periods of from about one to six hours may also be used to further enhance the color of the topaz following electron bombardment.

12 Claims, No Drawings

PROCESS FOR IRRADIATING TOPAZ AND THE PRODUCT RESULTING THEREFROM

BACKGROUND OF THE INVENTION

1. Field of the Invention

This invention relates to a method for processing topaz by the combined use of high energy neutron radiation and electron bombardment to produce a novel and superior product and to the novel product so produced by this unique processing method.

More particularly, this invention relates to the processing of colorless or pale colored topaz to produce a new product of a different color, particularly of the moderately deeper blue, which I describe as "American Blue" which color is of better quality and greater value than the original topaz gemstone. A slightly modified method may be used to produce a lighter blue color than the "American Blue" which I describe as "Super Sky Blue".

2. Description of the Prior Art

While it is well known to those skilled in the nuclear art that the bombardment of various gems, glasses and plastics by sub-atomic particles often produces changes in color as well as in other properties of these materials, neither the reason nor the mechanism of the process are comprehensively understood. Except in a few well known cases, the results of such subatomic particle bombardment are neither predictable nor obvious for any given material or type of radiation.

For example, it is known in the prior art that ordinary glass loses its transparency when subjected to gamma radiation. Pyrex, a type of glass, becomes amber and quartz becomes purple. Without special treatment, these colors gradually disappear if the glass is allowed to stand for a prolonged period or is subject to the action of intense light rays. This particular property has been used to detect radiation by noting the darkening of specially treated glass when exposed to further radiation as described by McAlpine and Rinehart in U.S. Pat. No. 2,782,319. On the other hand, various types of glasses have been developed also which resist the color changing effect of radiation such as disclosed in U.S. Pat. No. 2,747,105 which was issued to Fitzgerald, et al.

Likewise, the color and transparency of plastics have been known to be effected by nuclear irradiation as detailed in U.S. Pat. No. 2,855,517 issued to Rainer, et al.

The phenomenon is frequently described as being caused by the displacement of electrons from one part of the material to another resulting in the entrapment of some of the electrons in the color or "F" center of the material thereby changing its isotropy and consequently its color. (Stephenson, "Introduction to Nuclear Engineering," pp. 222, 256, and 350).

In the instant invention, I have discovered that by taking topaz gemstones which are colorless or of certain given colors and by properly subjecting them to the combined two step action of neutron bombardment, and then by electron bombardment, that I am able to permanently and completely change their color without impairing their other qualities.

Further, I have discovered also that by taking topaz gemstones which are colorless or of certain given colors and subjecting them first to high energy neutron bombardment and then bombarding them with high energy electrons I can produce topaz gemstones of a highly desirable, predictable, and permanent color.

As is well known, Topaz is a natural aluminum fluorisilicate which can be written in the formula, $[Al_2F_2SiO_4]$. It commonly occurs in high temperature veins probably formed in igneous intrusions in the presence of fluoride and water vapor. As a result, some of the fluoride is usually replaced by hydroxyl, giving it the variable composition, $[Al_2(F,OH)_2SiO_4.]$ Topaz occurs naturally in a wide range of colors (blue, yellow, green, orange, violet, pink and the highly desirable gold to sherry), but it is most commonly colorless.

The crystaline structure of topaz was determined independently by Pauling (1928) and by Alston and West (1928). It was described as belonging to the orthorhombic centrosymmetric space group pbnm and the structure has been successfully refined in that space group (Ribbe and Gibbs, 1971).

An important optical property or, more generally many gemstones including topaz is that known as dichroism of pleochroism. A stone possessing this property, when observed in different directions will show different colors or shades of color which may resemble each other more or less closely, or may differ considerably. The pleochroism of natural topaz is distinct but not strong.

The production of blue topaz from colorless stones by irradiation was first reported by F. H. Pough in 1957 as one of a large number of color changes observed in a variety of materials subjected to radiation treatment. The process was rediscovered and reported by Nassau in 1974 and by Nassau and Prescott in 1975.

Many people in the gemstone business believed the reporting of irradiation treatment to produce blue topaz provided an explanation for the large increase in the quantity of blue topaz available at that time. During the last ten years, more than a million carats of blue topaz have entered the world market.

Several types of irradiation can be used to alter the color of topaz including X and gamma rays, high energy charged particles, and neutrons. To date, however, the only generally useful forms of ionizing radiation include gamma rays from Co-60, high energy electrons from accelerators, and neutrons from nuclear reactors.

One of the principal qualities which determines the commercial value of a topaz stone is its color. Naturally occurring blue topaz stones are pale in color and their value in the market is therefore limited.

Only a small percentage of the topaz stones which have been irradiated by electrons will be a sufficiently intense blue color to be marketable. Therefore, the cost of producing the stones that will eventually be sold is increased by the cost for producing stones that are not salable.

When colorless or pale colored topaz stones are irradiated with neutrons, the pleochroism which results in different colors being seen when looking along different axes frequently results in an undesirable gray or "inky" appearance to many of the stones. The value of these stones is much less than the top quality blue gemstones.

When a colorless or pale-colored topaz is exposed to gamma rays, several colors of the yellow to reddish-brown tones develop in some of the stones at relatively low radiation doses, that is, doses of less than one megarad. As the dose is increased, a green-yellow to green blue color will develop in some stones, depending on the nature of the particular stone. If these particular stones are subsequently heat treated, a blue color can be brought out in the stone.

When by the nature of some stones an intense blue color is produced, it is generally a gray or "steely" blue.

In order for electrons to penetrate a significant thickness of topaz, energies in the range of 10 to 20 million electron-volts are required. To obtain these energies, it is necessary to accelerate the electrons in any one of a variety of machines including linear accelerators, Van de Graaff generators, and betatrons. A significant advantage in the use of electron accelerators is that the dose rates available are much higher than with gamma ray sources, enabling sufficient exposures to be given to the stones in only a few hours instead of several months. Another advantage is that the gray blue color produced by gamma rays and neutrons does not generally occur. Instead, in those stones which possess the needed natural property to turn blue, a very clear "sky" blue color is produced.

Neutrons can be produced by a variety of means, but the most practical method to generate the neutron intensities required to color meaningful quantities of topaz in a reasonable time is to use a nuclear reactor.

In general, all colorless or pale colored topaz will turn a blue color if given sufficient exposure to high energy neutrons. The color can be made darker than most intense color from either gamma rays or electrons. The pleochroism of topaz is very evident in neutron irradiated stones with the color axis appearing dark blue, light blue, and gray. This property results in a wide range of colors depending on the orientation of the crystalline axis with respect to the stone and the type of cutting used relative to the particular stone.

SUMMARY OF THE INVENTION AND OBJECTS

This invention relates to a process for enhancing the color of colorless and pale-colored topaz crystals by novel techniques and to the superior products so produced.

Fundamentally, the present invention relates to a process for the irradiation of topaz and the product resulting therefrom a process is described whereby the colorless or pale-colored topaz is irradiated in a neutron environment at an exposure level sufficient to bring the color of the topaz gemstone to a dark blue color, then subsequently irradiating said topaz gemstone with electrons at an exposure level in the range of approximately 1,000 to 10,000 megarads to produce a remarkable and enhanced "American" blue color., Occasionally, some of the topaz stones may require subsequent heating for a few hours from about 175° to 300 degrees Centigrade (347 to 572 degrees Fahrenheit) to obtain the desired color; however, in most cases, this is not necessary.

The purpose of such a process is to enhance the value of the relatively "normal" sky-blue topaz gem by moderately deepening the blueness of the color of the topaz gemstone to a relatively "rare" and more desirable blue color.

It is therefore an object of my invention to provide a method whereby nearly all colorless or pale-colored topaz can be treated to produce a very desirable blue color essentially equivalent to the best color that can be produced in only a small percentage of the world's topaz by irradiation with electrons only.

It is another object of my invention to provide a method whereby the stones which have an undesirable gray or "inky" color following neutron irradiation can be enchanced in value.

A further object of my invention is to provide a method of producing a new blue color in topaz that is unique, superior in quality and more valuable than any blue topaz existing prior to the discovery of my invention.

A still further object of my invention is to provide a method for additionally including heating following the irradiation of the topaz by neutrons and then electrons to cause the topaz gemstones which have not been completely changed in color to the color desired to be brought to such desired color.

DESCRIPTION OF THE PREFERRED EMBODIMENT OF THE INVENTION

Fundamentally, this invention relates to a new and novel method for processing topaz by the combined use of high energy neutron radiation and electron bombardment to produce a novel and superior topaz and to the particular topaz produced by this unique processing method.

More particularly, this invention relates to the processing of colorless or pale colored topaz to produce a new product of a different color, particularly of the moderately deeper blue, which I describe as "American Blue". American Blue topaz is of a better color, better quality and is of greater value than the original topaz gemstone. A variation of this process can be used to produce a topaz gemstone which has a very definitely enhanced blue coloration which I prefer to call a "Super Sky" blue. The "Super Sky" blue is a color which falls between the "Sky" blue and the "American" Blue.

The purpose of such a process is to enchance the value of the relatively "normal" sky-blue topaz gem by moderately deepening the blueness of the color of the topaz gemstone to a relatively "rare" and more desirable blue color.

METHOD FOR PRODUCING SUPER SKY BLUE TOPAZ

My process for improving the color and quality of the topaz product to produce a "Super Sky" blue colored topaz includes the follows steps:

First, the colorless or pale colored topaz gemstone is immersed in a neutron environment to irradiate the topaz at an exposure level sufficient to produce some color in the topaz so that when the topaz is subsequently exposed to electron bombardment in the range of approximately 1,000 to 10,000 megarads a blue color is obtained in the topaz. In most cases, the neutron bombardment of the topaz will produce a light blue color. However, it is not unusual for the topaz to be changed from its original colorless, or near colorless, state, to a brown, yellow, green, or blue color, or varying shades of these, and other, color combinations. The level of neutron irradiation to produce the light blue color will, of course, depend on a number of factors, including, just to name a few of the determinative factors involved, the amount of topaz being irradiated, the duration of the radiation exposure, the specific nature and character of the particular topaz being bombarded, and the relative sizes of the topaz gemstones. One of the key and most important elements is that the topaz be treated with a sufficient level of neutron radiation bombardment. Such a degree and amount of neutron radiation bombardment is achieved when some color is induced in the topaz. Of course, it has been found that such level of neutron radiation bombardment of the topaz is preferred to be when the stone is turned to a medium blue color.

Second, the neutron irradiated medium blue colored topaz is then irradiated with electrons at an exposure level in the range of from approximately 1,000 to 10,000 megarads to produce a remarkable and enhanced "Super Sky" blue colored topaz gemstone.

Occasionally, some of the neutron and electron irradiated topaz gemstones due to the particular nature and characteristics of the material forming the topaz, will not obtain the desired "Super Sky" blue coloration, but, instead, will become greenish-blue or greenish-yellowish. When this occurs, the desired "Super Sky" blue color can be obtained by further treating the topaz by heating the topaz for a few hours, that is, from one to six hours, at between 250° to 600 degrees Fahrenheit (121° to 315 degrees Centegrade). By heating, I find that nearly all of the topaz stones heat treated in this manner will have the very desirable color and are highly marketable.

METHOD FOR PRODUCING AMERICAN BLUE TOPAZ

The process which I have discovered for improving the color and quality of the topaz product to produce a "American" blue colored topaz includes the follows steps:

First, the colorless or pale colored topaz gemstone is immersed in a neutron environment to irradiate the topaz at an exposure level sufficient to produce some color in the topaz. Sometimes, this involves the production of a steely, or dark blue, or gray color. The level of neutron irradiation to produce the blue color will, of course, depend on a number of factors, including, just to to name a few of the determinative factors involved, the amount of topaz being irradiated, the duration of the radiation exposure, the specific nature and character of the particular topaz being bombarded, and the relative sizes of the topaz gemstones. One of the key and most important elements is that the topaz be treated with a sufficient level of neutron radiation bombardment. Such a degree and amount of neutron radiation bombardment is achieved when some color is induced in the topaz. Of course, it has been found that such level of neutron radiation bombardment of the topaz occurs when some color appears in the topaz. In some cases, this level is achieved when the topaz gemstone is turned a steely or gray color.

Second, the neutron irradiated dark blue colored topaz is then irradiated with electrons at an exposure level in the preferred range of from approximately 1,000 to 10,000 megarads to produce a remarkable and enhanced "American" blue colored topaz gemstone. "American" blue is a new, extremely bright, intense blue color.

Occasionally, as in the previous method which I have described to produce a "Super Sky" blue topaz, some of the neutron and electron irradiated topaz gemstones because of the particular nature and characteristics of the material forming the topaz, will not obtain the desired "American" blue coloration, but, instead, will become brownish or yellowish. When this occurs, the desired "American" blue color can been obtained by further treating the topaz by heating it for a few, that is, two or more hours, at about 250° to 900 degrees Fahrenheit (121° to 482 degrees Centigrade). As a practical matter, the preferred time period for heating the topaz is from one to six hours. Further, it should be clearly understood and noted that heating of the topaz to obtain the desired final color change may be accomplished at lower temperatures. Such lower temperatures are from about 250 degrees Fahrenheit, but, this, of course, requires a longer period of heating than is accomplished at higher temperatures. Also, if the temperature is raised to approximately 900 degrees Fahrenheit, the desired color change can be accomplished in a shorter time frame. Through this process of heating, I find that nearly all of the topaz stones heat treated in this manner will have the very desirable color and are highly marketable.

It should be noted that the within described process and product is intended to include all variations in composition of topaz from any and all locations in the world and all forms of topaz including, but not limited to, rough and preformed stones, all manner of carved stones, and all manner of polished and cut stones. The neutron irradiation described includes treatment by neutrons of all energies produced by any means including but not limited to isotopic sources, accelerator sources, and nuclear reactors. The electron irradiation includes irradiation by electrons produced by any technique and accelerated by any method.

It should be clearly understood that certain obvious modifications will occur to those skilled in the art to which this invention pertains. However, such obvious modifications are intended to be within the scope and purview of the present invention herein, and the outer boundaries of the scope of the instant invention are intended to be limited and determined only by the scope of the claims appended hereto.

What is claimed is:

1. A method for producing color change in topaz by the use of high energy neutron radiation and electron bombardment comprising the steps of:
    (a) irradiating colorless or pale-colored topaz in a neutron environment to an exposure level sufficient to produce some color so that when subsequently irradiated with electrons from approximately 1,000 to 10,000 megarads a bright blue color will be obtained; and then,
    (b) irradiating the neutron bombarded topaz with electrons at an exposure level of from approximately 1,000 to 10,000 megarads until the desired bright blue color is obtained.

2. The method of claim 1 further comprising the step of heating the topaz to a temperature of about 250 degrees Farenheit unti the desired color is obtained in the topaz.

3. The method of claim 2 wherein the step of heating the topaz to a temperature of about 250 degrees Farenheit includes heating said topaz for a period of at least two hours.

4. The method of claim 2 wherein the step of heating the topaz to a temperature of about 250 degrees Farenheit includes heating said topaz for a period of time ranging from about one to six hours.

5. The method of claim 2 wherein said temperature is from about 250° to 900 degrees Fahrenheit.

6. The method of claim 5 wherein said temperature is maintained at said temperature from a period of about one to six hours.

7. A method for producing color change in colorless or pale-colored topaz comprising the steps of:
    (a) irradiating the topaz in a neutron environment to an exposure level sufficient to change the original color state of the topaz to a steely, dark blue, or gray color;

(b) irradiating the neutron bombarded topaz with electrons at an exposure level in the range of from approximately 1,000 to 10,000 megarads until a bright blue color is obtained.

8. A method for producing color change in colorless or pale-colored topaz comprising the steps of:

(a) irradiating the topaz in a neutron environment to an exposure level sufficient to change the original color state of the topaz to a brown, yellow, green, or blue color;

(b) irradiating the neutron bombarded topaz with electrons at an exposure level in the range of from approximately 1,000 to 10,000 megarads until an enhanced blue color is obtained.

9. The method of claim 2 further including the step of heating the topaz to a temperature of about 250 degrees Fahrenheit for a period of time ranging from about one to six hours.

10. The method of claim 9 wherein said temperature is from about 250° to 900 degrees Fahrenheit.

11. The method of claim 8 further including the step of heating the topaz to a temperature of about 250 degrees Fahrenheit for a period of time ranging from about one to six hours.

12. The method of claim 11 wherein said temperature is from about 250° to 600 degrees Fahrenheit.

* * * * *